US007816772B2

(12) United States Patent
Engel et al.

(10) Patent No.: US 7,816,772 B2
(45) Date of Patent: Oct. 19, 2010

(54) METHODS AND APPARATUS FOR MULTI-STAGE MOLDING OF INTEGRATED CIRCUIT PACKAGE

(75) Inventors: Raymond W. Engel, Southbridge, MA (US); Nirmal Sharma, Shrewsbury, MA (US); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 701 days.

(21) Appl. No.: 11/693,183

(22) Filed: Mar. 29, 2007

(65) Prior Publication Data
US 2008/0237818 A1    Oct. 2, 2008

(51) Int. Cl.
*H01L 23/495* (2006.01)
*H01L 23/52* (2006.01)

(52) U.S. Cl. .............. 257/676; 324/252; 361/813; 257/692; 257/684; 257/701; 257/685

(58) Field of Classification Search .......... 257/676, 257/692, 684, 701, 685; 324/252; 361/813
See application file for complete search history.

(56) References Cited

U.S. PATENT DOCUMENTS

| 5,434,105 | A | 7/1995 | Liou |
| 6,545,332 | B2* | 4/2003 | Huang ............ 257/433 |
| 6,770,163 | B1 | 8/2004 | Kuah et al. |
| 6,781,359 | B2 | 8/2004 | Stauth et al. |
| 7,385,394 | B2 | 6/2008 | Auburger et al. |
| 2005/0167790 | A1* | 8/2005 | Khor et al. ............ 257/666 |
| 2006/0181263 | A1 | 8/2006 | Doogue et al. |

FOREIGN PATENT DOCUMENTS

| EP | 0 898 180 A2 | 2/1999 |
| EP | 0 898 180 A3 | 2/1999 |
| JP | 2000183241 | 6/2000 |
| JP | 2001141738 | 5/2001 |
| JP | 2003177171 | 6/2003 |

OTHER PUBLICATIONS

Raw English Translations of JP-2001-183241 and JP-2001-141738.*
Notification of Transmittal of The International Search Report dated Jul. 15, 2008, PCT/US2008/053551.

(Continued)

*Primary Examiner*—Kenneth A. Parker
*Assistant Examiner*—Joseph Nguyen
(74) *Attorney, Agent, or Firm*—Daly, Crowley, Mofford & Durkee, LLP (57) ABSTRACT

Methods and apparatus for providing an integrated circuit using a multi-stage molding process to protect wirebonds. In one embodiment, a method includes attaching a die to a leadframe having a lead finger, attaching a wirebond between the die and the leadfinger, applying a first mold material over at least a portion of the wirebond and the die and the leadfinger to form an assembly, waiting for the first mold material to at least partially cure, and applying a second mold material over the assembly.

7 Claims, 7 Drawing Sheets

Pre-Mold highlighted in Finished Package

OTHER PUBLICATIONS

The International Search Report dated Jul. 15, 2008, PCT/US2008/053551.

Written Opinion of the International Searching Authority dated Jul. 15, 2008, PCT/US2008/053551.

True Zero-Speed Low-Jitter High Accuracy Gear Tooth Sensor, ATS625LSG, 2005, pp. 1-21, Allegro MicroSystems, Inc., Worcester, MA 01615.

Two-Wire True Zero Speed Miniature Differential Peak-Detecting Gear Tooth Sensor, ATS645LSH, 2004, pp. 1-14, Allegro MicroSystems, Inc., Worcester, MA 01615.

Notification Concerning Transmittal of International Preliminary Report on Patentability (Chapter 1 of the Patent Cooperation Treaty), PCT/US2008/053551 dated Oct. 8, 2009, 2 pages.

Written Opinion of the International Searching Authority, PCT/US2008/053551 dated Oct. 8, 2009, 5 pages.

* cited by examiner

Pre-Mold highlighted in Finished Package

*FIG. 2A*

Pre-Mold highlighted in Finished Package

METHODS AND APPARATUS FOR MULTI-STAGE MOLDING OF INTEGRATED CIRCUIT PACKAGE

BACKGROUND

As is known in the art, integrated circuits (ICs) can include a leadframe to support a die and to provide external connections for the IC package. Connections between the die and the leadframe fingers can be made with wire bonds, for example. For plastic packages, a leadframe/die assembly is overmolded with a plastic material.

In one conventional package, a sensor includes a so-called K-type assembly having a backside to which a magnet is adhered. The assembly with the attached magnet is molded or encased into a sensor housing. In one known process, a die is attached to a leadframe, a flux concentrator and/or magnet is attached, and the assembly is overmolded.

During the molding process, the relatively delicate wirebonds may be broken by the pressurized flow of plastic material. In addition, the fragility of the wirebonds may limit the efficiency of the molding process.

SUMMARY

The present invention provides methods and apparatus for an integrated circuit having a first mold material applied to protect wirebond connections between a die and a leadfinger and a second mold material applied over the first mold material. By protecting the wirebonds with the first mold material, the second mold material can be applied at relatively high pressures. With this arrangement, yields are improved due to less wirebond damage. While the invention is primarily shown and described in conjunction with sensor integrated circuits, it is understood that the invention is applicable to integrated circuits in general in which it is desirable to protect delicate connections from a die.

In one aspect of the invention, a method comprises attaching a die to a leadframe having a lead finger, attaching a wirebond between the die and the leadfinger, applying a first mold material over at least a portion of the wirebond and the die and the leadfinger to form an assembly, waiting for the first mold material to at least partially cure, and applying a second mold material over the assembly.

The method can further comprise one or more of the following features: applying the mold material to only a die-side of the leadframe, applying the first mold material to encapsulate the wirebond, applying the first mold material to encapsulate the die on the leadframe, selecting a material for the first mold material based at least in part upon similarity of coefficient of expansion with a magnet, the first and second mold materials are different, selecting a material for the first and/or second mold material based at least in part upon filler size, applying the second mold material at a substantially higher pressure than a pressure at which the first mold material was applied, the die includes one or more Hall elements, attaching a concentrator to the assembly, and the wirebond includes a gold wire.

In another aspect of the invention, an integrated circuit device comprises a die attached to a leadframe having a lead finger, a wirebond to make a connection between the die and the leadfinger, a first mold material covering at least a portion of the wirebond and the die and the leadfinger to form an assembly, and a second mold material overmolding the assembly.

The device can further include one or more of the following features: the first mold material is only on a die-side of the leadframe, the first mold material encapsulates the wirebond, the first mold material encapsulates the die on the leadframe, the first mold material has a coefficient of expansion compatible with a coefficient of expansion for a magnet, the first and second mold material are different, the die includes one or more Hall elements, the wirebond includes a gold wire.

BRIEF DESCRIPTION OF THE DRAWINGS

The exemplary embodiments contained herein will be more fully understood from the following detailed description taken in conjunction with the accompanying drawings, in which.

DETAILED DESCRIPTION

Figure 1:
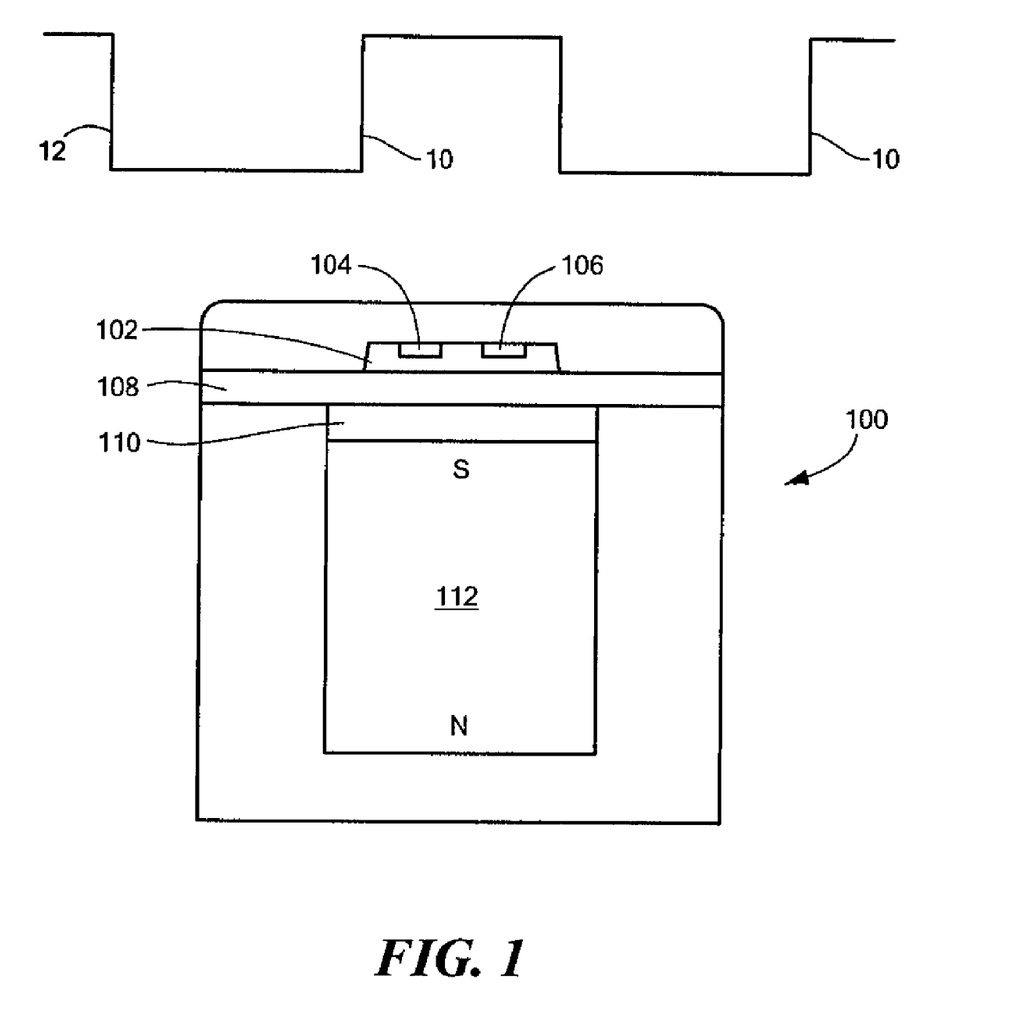
FIG. 1 is a schematic representation of an exemplary integrated circuit having a multi-stage molding process in accordance with exemplary embodiments of the invention.

FIG. 1 shows an exemplary integrated circuit (IC) 100 provided as a sensor fabricated with a multi-step molding process in accordance with exemplary embodiments of the invention. In the illustrative embodiment, the sensor 100 is a gear tooth sensor (GTS) to detect motion of teeth 10 on a gear 12. In general, a first molding step is performed to protect wirebonds. After the first molding process is complete, a second molding step is performed to provide the final package configuration.

In an exemplary embodiment, the sensor 100 includes a Hall IC 102 having first and second Hall elements 104, 106 disposed on a leadframe 108. A concentrator 110, shown as a pole piece concentrator, is disposed on a backside of the assembly with a magnet 112 secured to the concentrator. As described more fully below, in an exemplary embodiment the assembly is molded in a first step to protect wirebonds from the IC 102 to the leadframe 108 prior to overmolding the assembly having the concentrator 110 and magnet 112.

Figure 1A:
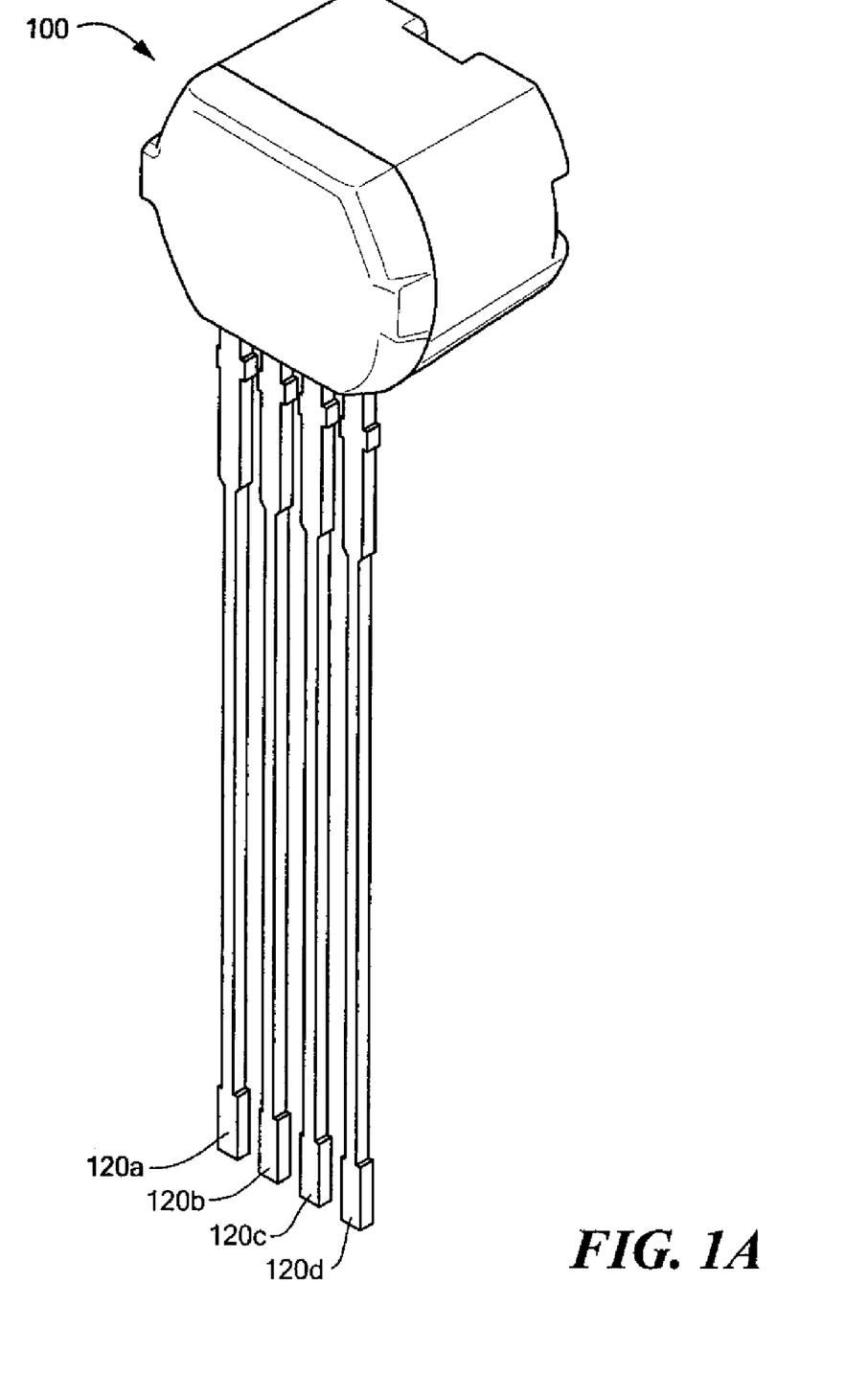
FIG. 1A is a pictorial representation of the integrated circuit of FIG. 1.

FIG. 1A shows an exemplary IC package 100 for the Hall integrated circuit of FIG. 1 in a 4-pin 120a-d SIP (single inline package) configuration. The IC 100 is a two-wire differential peak-detecting gear tooth sensor (GTS).

Figure 2A:
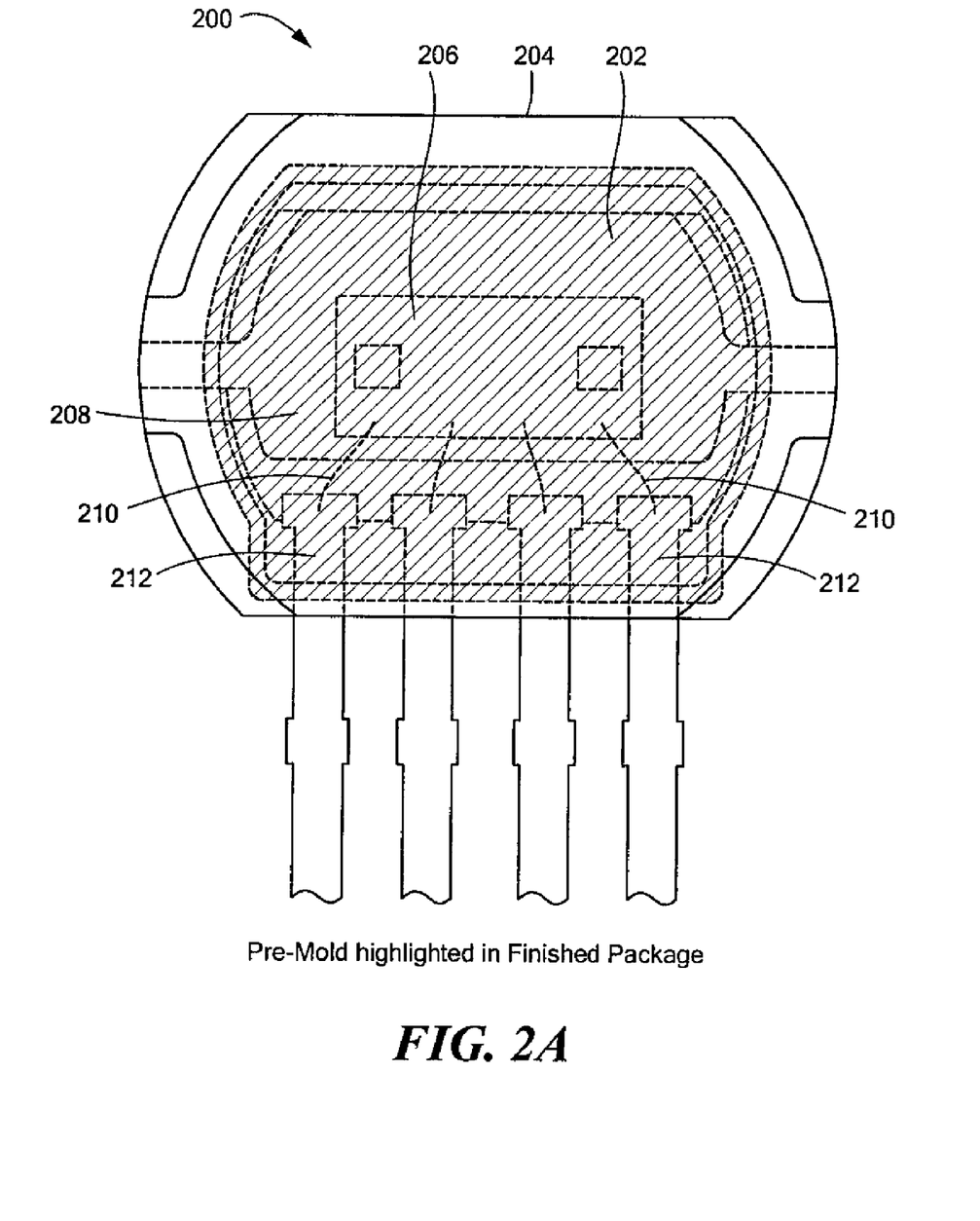
FIG. 2A is a transparent top view line drawing of an exemplary integrated circuit having a multi-stage molding process in accordance with exemplary embodiments of the invention.
Figure 2B:
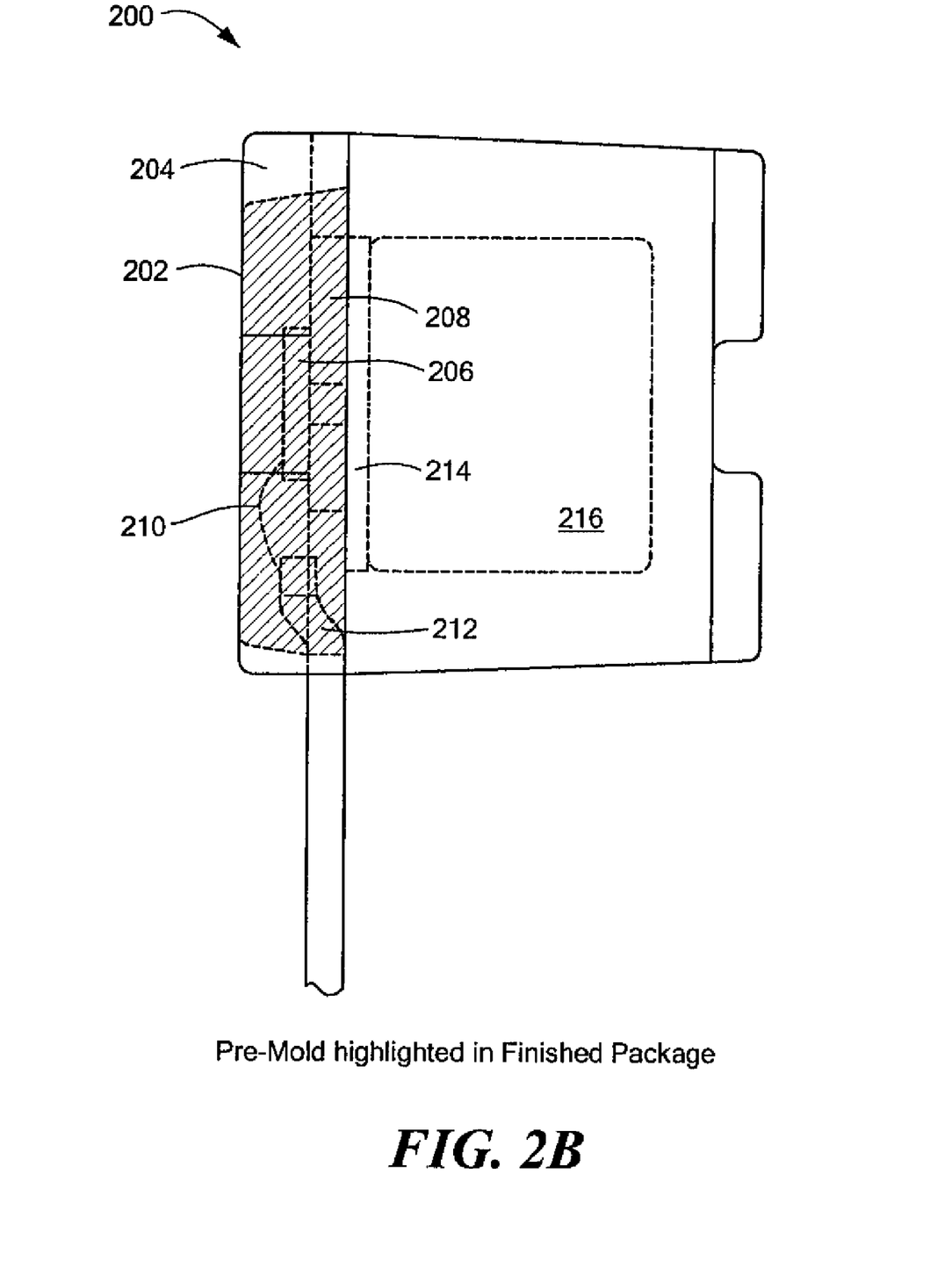
FIG. 2B is a transparent side line drawing of the integrated circuit of FIG. 2A.

FIGS. 2A and 2B show cross-sectional views illustrating an exemplary integrated circuit 200 having a first mold material 202 and a second mold material 204 fabricated in a multi-stage molding process in accordance with exemplary embodiments of the invention. The IC 200, shown as a sensor IC, includes a die 206 disposed on a leadframe 208. A series of wirebonds 210 make electrical connections between the die 206 and leadfingers 212 of the leadframe 208. The die/wirebond assembly is overmolded with the first mold material 202. The IC 200 further includes a concentrator 214 and magnet 216 overmolded by the second material 204.

In the illustrated embodiment, the wirebonds 210 extend from the die 206 to only one side of the leadframe 208. In other embodiments, wirebonds can extend from both sides and/or ends of the die 206.

The first mold material 202 is applied in a manner to protect the integrity of the wirebonds 210. In one embodiment, the first mold material 202 encapsulates only the die 206 and wires 210 on the die side of the leadframe 208. No molding occurs on the backside of the package until additional process steps are performed before completion.

It is understood that wirebonds 210 can be formed from materials and/or in dimensions that render the wirebonds susceptible to damage. While some materials are desirable for electrical conductivity, ease of connection, and/or ease of fabrication, e.g., ductility, such materials may be easily deformed. Gold is an exemplary material commonly used for wirebonds. Gold wire diameter for sensor applications generally ranges from about 0.9 mil to about 1.3 mils in diameter. Such dimensions provide suitable electrical connections, however, mold material applied under excessive pressure can easily move, bend, break or otherwise degrade the wirebond connection.

A variety of suitable epoxy molding compounds well known to one of ordinary skill in the art can be used to encapsulate the pre-mold assembly, as well as the overmold of the second mold material 204. One such compound is MG52F by Hysol Corporation for the first and second mold material 202, 204. This material has process characteristics that have some similarity to the magnet material. The coefficient of expansion between the encapsulate assembly and the magnet 216 should be similar so that cracking does not occur when parts are subjected to extreme temperature cycles, such as the conditions seen by a part employed in an automobile.

An alternative compound for the first and/or second mold material 202, 204 is SUMIKON EME-6600R by Sumitomo Bakelite Co. Ltd. A factor in selecting a suitable compound is obtaining one in which the filler distribution is towards the high side of the range. For example, a filler size of 5-10 um will produce significant amounts of flash and bleed, whereas 30 um or more will almost eliminate it. As is well known in the art, semiconductor molds have vents that allow air to escape while containing the molding compound. Minute resin bleed will be seen in these areas as resin rich material will seep through. Molds are designed with a particular compound in mind with vents regulated to what the compound of choice will allow to pass.

Factors to consider when selecting the first mold material 202 are similarity of coefficient of expansion with the magnet 216 and the amount of flash and resin bleed, which can interfere with the magnet 216 and concentrator 214 attachment and overmolding of the second mold material 204.

In one embodiment, the same material is used for the first and second mold materials 202, 204. In other embodiments, the first and second mold materials are different to meet the needs of a particular application. In addition, while first and second molding steps are shown and described, it is understood that further molding steps can be used to apply the same or different materials, to protect other assembly features, to achieve particular geometries and the like.

In general, mold setup and cure times in the premold (first mold material 202) and overmold (second mold material 204) processes can be selected based upon the mold materials and mold geometry. In an exemplary embodiment, processing begins by using 0 seconds preheat time, 5 second transfer time, and 120 seconds cure time. Suitable transfer pressure and transfer times are used to encapsulate the die and wires so no resultant wire sway became evident. Significant increases in transfer pressure and transfer time can be applied during the overmold process without the risk of damaging or moving the bonded wire, which otherwise cannot be done without pre-molding. The significantly higher transfer pressure and time during the overmold process are helpful to properly compact the second mold material due to the relatively large depth of the mold cavity created by the size of the magnet.

It is understood that the premold and overmold processes have different parameters. In general, the premold process (first mold material 202) uses a relatively slow injection speed and initial packing pressure to keep the wires from sweeping. The first mold material 202 protects the wires and die while the subsequent overmold operations for the second mold material 204 take place. The overmold process can use relatively high transfer speeds and pressures to allow the second mold material 204 to get around the deep cavity around the magnet. Without the higher pressures for the second mold material 204 enabled by the presence of the first mold material 202 protecting the wirebonds 210 and die 202, it would be difficult, if not impossible, to eliminate voids in or around the magnet area. By protecting the wirebonds 210 from damage during subsequent processing steps, yields increase for more efficient IC fabrication.

Once application of the first mold material 202 is complete, the pre-mold assembly is manipulated to have the concentrator 214 and magnet 216 attached to the backside of the leadframe 208 in a manner well known to one of ordinary skill in the art. In an exemplary embodiment, the first mold material 202 molds only the front of the package to protect the die 206 and wires 210 leaving the backside free for further processing. In an exemplary embodiment, the concentrator 214 and magnet 216 are attached to the backside using an adhesive and then oven cured prior to final overmolding.

For example, application of the first mold material 202 is limited in time and pressure due to the presence of fine wirebonds, e.g., 1 mil gold wires. The package needs to be completely molded with no voids with relatively low pressure so as not to move or otherwise impact the gold wires. Once the first mold material 202 is set, the second mold material 204 can applied without limitations of the wirebonds since they are encapsulated in the first mold material 202. Various post processing steps can be performed without regard to the wirebonds.

Figure 3:
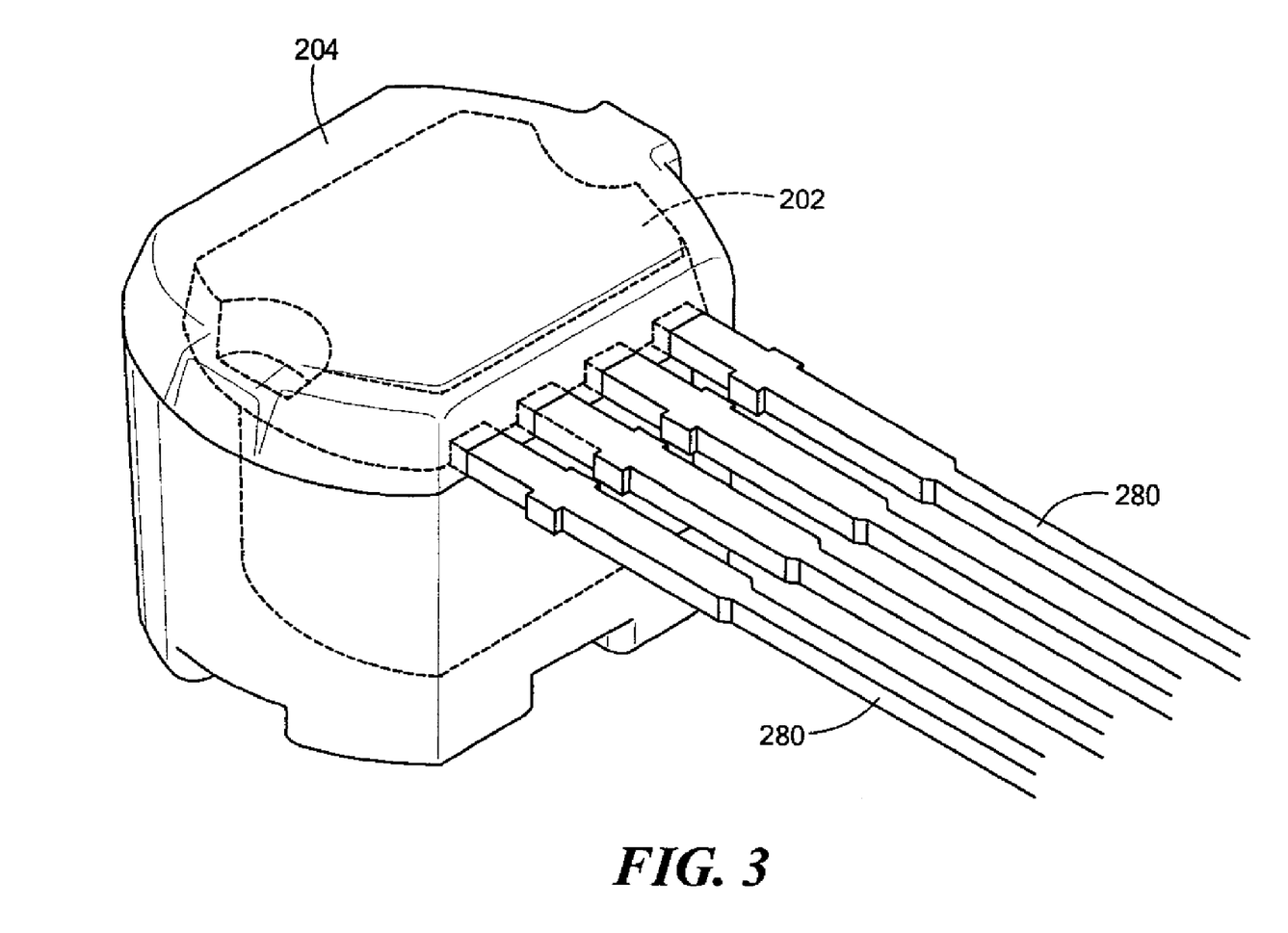
FIG. 3 is a partially transparent perspective view of an exemplary integrated circuit having a multi-stage molding process in accordance with exemplary embodiments of the invention.

FIG. 3 is a perspective view of the finished assembly 200 of FIGS. 2A and 2B in which the second mold material 204 is partially transparent. As can be seen, the first mold material 202 encapsulates the die/leadframe/wirebond assembly. In an exemplary embodiment, the second mold material 204 partially encapsulates the first mold material 202. Leads 280 extend from the device for external connection.

Figure 4:
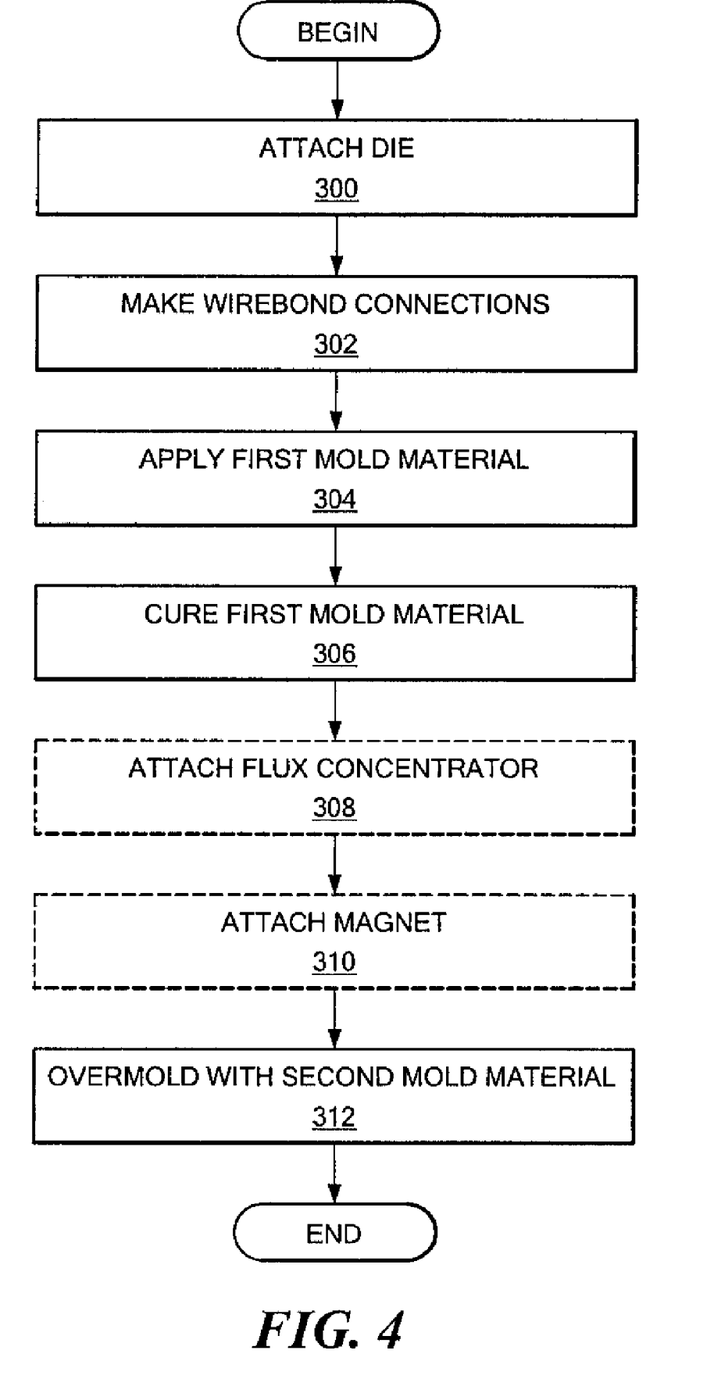
FIG. 4 is a flow diagram showing an exemplary sequence of steps to implement a multi-stage molding process for an integrated circuit in accordance with exemplary embodiments of the invention.

FIG. 4 shows an exemplary sequence of steps to fabricate an IC, such as a sensor, in a multi-step molding process in accordance with exemplary embodiments of the invention. In step 300, a die is attached to a leadframe in a manner well known to one of ordinary skill in the art. Wirebonds are then attached between selected locations on the die and the leadfingers to provide desired electrical connections in step 302. A first mold material is then used to at least partially cover the wirebonds in step 304. In one embodiment, the first mold material encapsulates the wirebonds.

In step 306, the first mold material cures until at least a threshold level is achieved. In optional step 308 a flux concentrator is secured to the leadframe. In optional step 310, a magnet is secured to the concentrator. This assembly is then overmolded with a second mold material in step 312 to provide IC in a finished package. It is understood that the finished package may undergo additional processing to meet certain desired physical and/or electrical specifications.

While exemplary embodiments shown and described herein are directed to sensors, and particularly sensors having concentrators and/or magnets, it is understood that the invention is applicable to IC fabrication processes in general in which an assembly includes wire-bonds, or other delicate connections, between a leadframe and a die. In addition, it is understood that embodiments having more than two molding steps using the same or different materials are contemplated.

Figure 5:
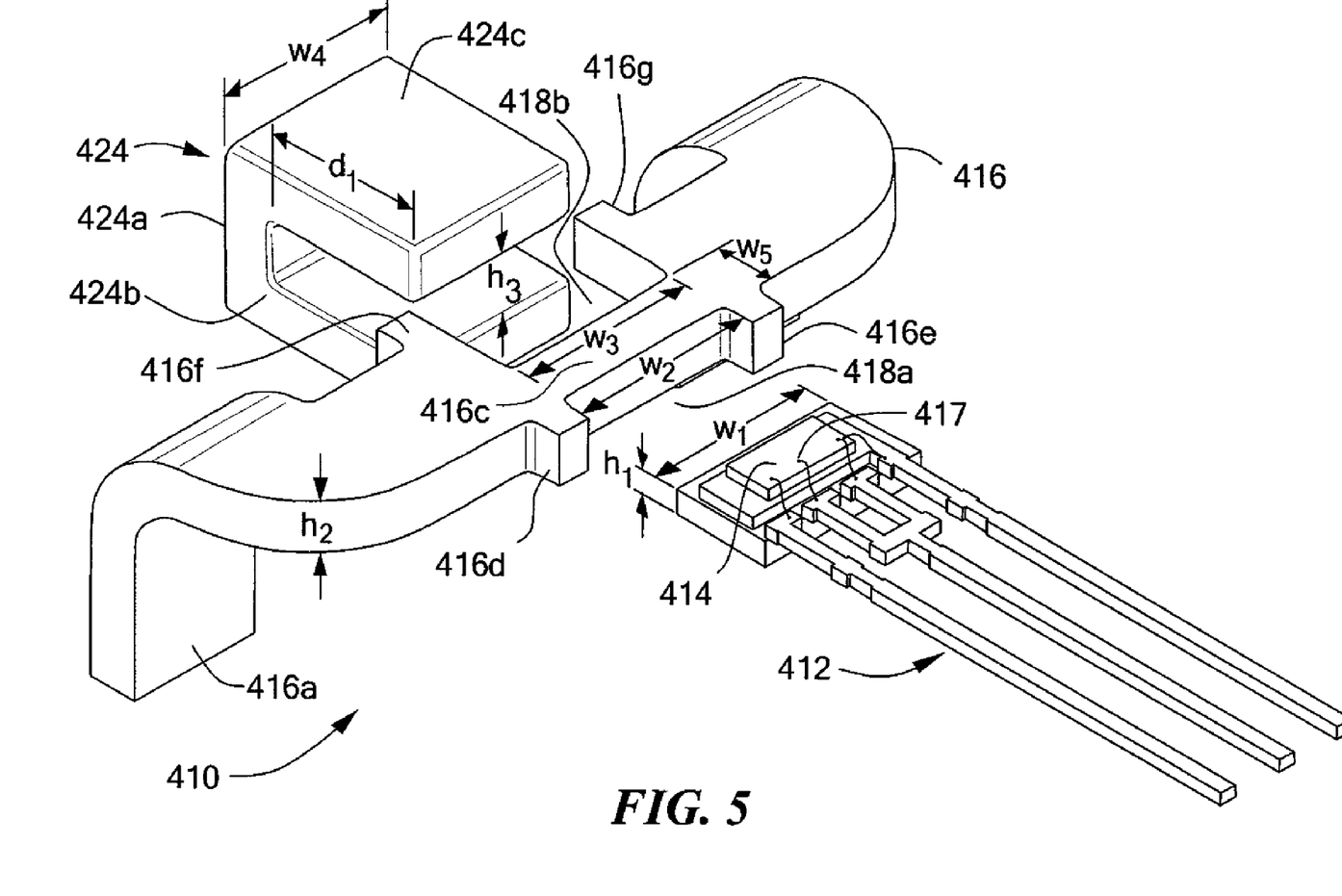
FIG. 5 is a pictorial representation of an integrated circuit sensor having wirebonds that can be protected by a first mold material to form an assembly that can be overmolded with a second mold material.

FIG. 5, for example, shows a miniaturized, integrated current sensor 410 including a magnetic field transducer, here in the form of Hall Effect sensor 412, a current-carrying conductor 416 and a magnetic core 424. The conductor 416 includes features for receiving portions of the Hall Effect sensor 412 and the magnetic core 424 such that the elements are maintained in a fixed position relative to each other. In the illustrated embodiment, the conductor 416 has a first notch 418a and a second notch 418b substantially aligned with the first notch. In assembly, at least a portion of the Hall Effect sensor 412 is disposed in the first notch 418a. The magnetic core 424 is substantially C-shaped and has a central region 424a and a pair of substantially parallel legs 424b, 424c extending from the central region. In assembly, at least a portion of the central region 424a is disposed in the second notch 418b of the conductor such that each leg 424b, 424c covers at least a portion of a respective surface of the Hall Effect sensor 412.

The Hall Effect sensor 412 is provided in the form of an integrated circuit containing a sensor die 414 with wirebonds 417 fixed in position with a first mold material to form an assembly that is overmolded with a second mold material, as described above. The integrated Hall Effect sensor 412 can be provided in different package types, such as the "K" single in line (SIP) package. Further structural details are set forth in U.S. Pat. No. 6,781,359, which is incorporated herein by reference.

While exemplary embodiments of the invention are primarily shown and described in conjunction with a Hall sensor, it is understood that the invention is applicable to integrated circuits in general, and sensors, in particular magnetic field sensors, provided for example as Hall sensors, GMR (giant magnetoresistance), AMR (anisotropic magnetoresistance), TMR (tunnel magnetoresistance), and MTJs (Magnetic tunnel junctions).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit device, comprising:
   at least one die attached to a leadframe having lead fingers;
   wirebonds making connections between the at least one die and the leadfingers;
   a first mold material injected at a first pressure to prevent wire sway of the wirebonds for encapsulating the wirebonds and covering at least a portion of the at least one die and the leadfingers, wherein the first mold material is only on a die-side of the leadframe and overmolds all wirebonds connected to the at least one die;
   a concentrator having a first side and a second side, wherein the first side is secured to a non die-side of the leadframe;
   a magnet secured to the second side of the concentrator, and
   a second mold material injected at a second pressure greater than the first pressure for overmolding the at least one die, first mold material, concentrator, and magnet.

2. The device according to claim 1, wherein the first mold material encapsulates the at least one die on the leadframe.

3. The device according to claim 1, wherein the first mold material has a coefficient of expansion compatible with a coefficient of expansion for a magnet.

4. The device according to claim 1, wherein the first and second mold material are different.

5. The device according to claim 1, wherein the at least one die includes one or more magnetic field sensors.

6. The device according to claim 5, wherein the magnetic field sensor includes a Hall element.

7. The device according to claim 1, wherein the wirebond includes a gold wire.

* * * * *